United States Patent
Clark et al.

(10) Patent No.: US 8,501,635 B1
(45) Date of Patent: Aug. 6, 2013

(54) MODIFICATION OF REO BY SUBSEQUENT III-N EPI PROCESS

(71) Applicants: Andrew Clark, Los Altos, CA (US); Robin Smith, Palo Alto, CA (US); Rytis Dargis, Fremont, CA (US); Erdem Arkun, San Carlos, CA (US); Michael Lebby, Apache Junction, AZ (US)

(72) Inventors: Andrew Clark, Los Altos, CA (US); Robin Smith, Palo Alto, CA (US); Rytis Dargis, Fremont, CA (US); Erdem Arkun, San Carlos, CA (US); Michael Lebby, Apache Junction, AZ (US)

(73) Assignee: Translucent, Inc., Palo Alto, CA (US)

( * ) Notice: Subject to any disclaimer, the term of this patent is extended or adjusted under 35 U.S.C. 154(b) by 0 days.

(21) Appl. No.: 13/631,906

(22) Filed: Sep. 29, 2012

(51) Int. Cl.
*H01L 21/31* (2006.01)

(52) U.S. Cl.
USPC ............ 438/779; 257/E21.267; 252/521.1

(58) Field of Classification Search
USPC ........... 438/46, 483, 767, 779; 257/E21.267, 257/E21.28; 252/521.1
See application file for complete search history.

(56) References Cited

U.S. PATENT DOCUMENTS

| 6,045,626 | A  | * | 4/2000 | Yano et al. ................ 148/33.4 |
| 6,734,453 | B2 | * | 5/2004 | Atanackovic et al. .......... 257/19 |
| 8,268,076 | B2 | * | 9/2012 | Schroeder et al. ............ 117/89 |
| 8,394,194 | B1 | * | 3/2013 | Dargis et al. ................. 117/4 |

* cited by examiner

*Primary Examiner* — William D Coleman
(74) *Attorney, Agent, or Firm* — Parsons & Goltry; Robert A. Parsons; Michael W. Goltry

(57) ABSTRACT

A method of growing single crystal III-N material on a semiconductor substrate includes providing a substrate including one of crystalline silicon or germanium and a layer of rare earth oxide. A layer of single crystal III-N material is epitaxially grown on the substrate using a process that elevates the temperature of the layer of rare earth oxide into a range of approximately 750° C. to approximately 1250° C. in the presence of an N or a III containing species, whereby a portion of the layer of rare earth oxide is transformed to a new alloy.

20 Claims, 6 Drawing Sheets

| | Si | | GaN |
|---|---|---|---|
| LATTICE PARAMETER, (Å) | CUBIC $a_c$ | TRANSFORMED TO HEXAGONAL $a_h$ | HEXAGONAL $a_h$ |
| | 5.431 | 3.840 | 3.189 |
| LATTICE MISMATCH, (%) | | −16.9 | |

| | ErN | | GaN |
|---|---|---|---|
| LATTICE PARAMETER, (Å) | CUBIC $a_c$ | TRANSFORMED TO HEXAGONAL $a_h$ | HEXAGONAL $a_h$ |
| | 4.842 | 3.424 | 3.189 |
| LATTICE MISMATCH, (%) | | −6.9 | |

*FIG. 1B*

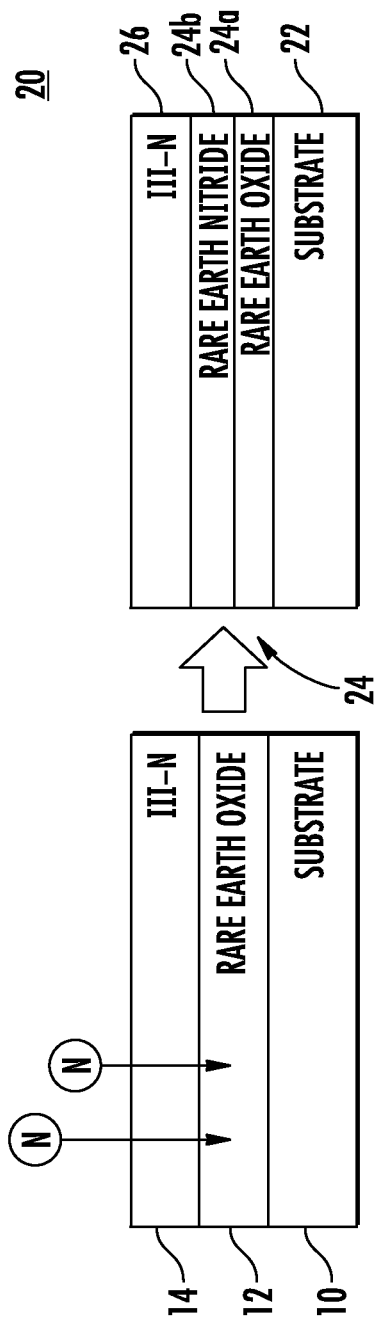

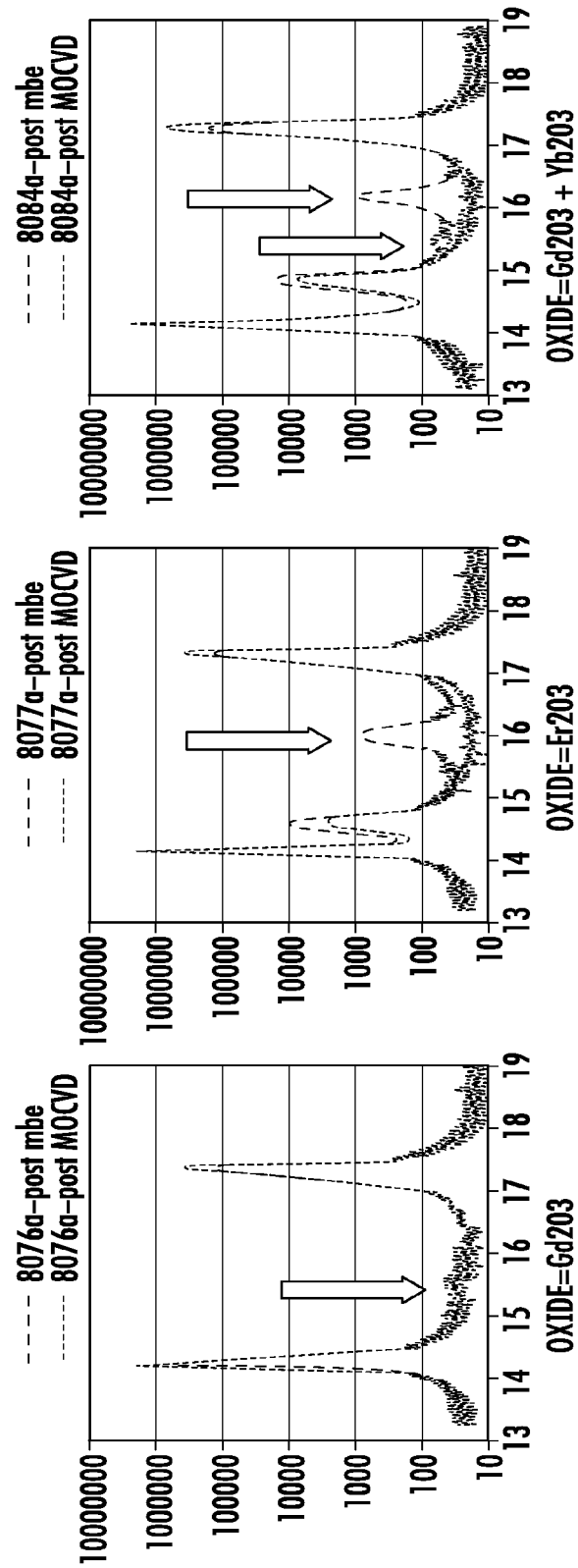

MODIFICATION OF REO BY SUBSEQUENT III-N EPI PROCESS

FIELD OF THE INVENTION

This invention relates in general to the epitaxial growth of a layer of III-N material on a semiconductor substrate such as silicon or germanium.

BACKGROUND OF THE INVENTION

In the semiconductor industry, it is known that growing a III-N material, such as GaN, on a silicon substrate is difficult due in large part to the large crystal lattice mismatch (−16.9%) between silicon and GaN. Some efforts have been made to intersperse layers of rare earth oxides between the substrate and the III-N layer. However, one of the smaller rare earth oxides, which is $Yb_2O_3$, (note this is not the smallest just a good example; both $Lu_2O_3$ and $Sc_2O_3$ are smaller, though sometimes Sc is not considered a RE) while substantially crystal lattice matched to silicon through additional layers ($Yb_2O_3$ is not lattice matched to silicon which is why we usually put a layer of $Gd_2O_3$ first or we might consider grading Gd to Yb—also shown in FIG. 1) still has a 13.6% mismatch with GaN. Thus, simply growing layers of rare earth oxides between the substrate and the III-N material does not sufficiently reduce the strain due to the lattice mismatch.

It would be highly advantageous, therefore, to remedy the foregoing and other deficiencies inherent in the prior art.

Accordingly, it is an object of the present invention to provide new and improved methods for the growth of single crystal III-N materials on a semiconductor substrate.

It is another object of the present invention to provide new and improved methods of more closely lattice matching single crystal III-N materials to a semiconductor substrate.

It is another object of the present invention to provide new and improved substantially lattice matched single crystal III-N material epitaxially grown on a semiconductor substrate.

SUMMARY OF THE INVENTION

Briefly, the desired objects and aspects of the instant invention are achieved in accordance with a preferred method of growing single crystal III-N material on a semiconductor substrate including a step of providing a substrate including one or more layers of one of crystalline silicon or germanium and a layer of rare earth oxide and epitaxially growing a single crystal III-N material on the substrate using a process that elevates the temperature of the layer of rare earth oxide into a range of approximately 750° C. to approximately 1250° C. in the presence of one of a nitrogen containing species or a III-material species, whereby a portion of the layer of rare earth oxide is transformed to a new alloy.

The desired objects and aspects of the instant invention are also achieved in accordance with a preferred method of growing single crystal III-N material on a semiconductor substrate. The method includes providing a substrate including one of crystalline silicon or germanium. A layer of rare earth oxide is epitaxially grown on the substrate and a layer of single crystal III-N material is epitaxially grown on the layer of rare earth oxide using a process that elevates the temperature of the layer of rare earth oxide into a range of approximately 750° C. to approximately 1250° C. in the presence of an N containing species, whereby a portion of the layer of rare earth oxide is transformed to a new alloy.

The desired objects and aspects of the instant invention are also achieved in accordance with a preferred method of growing single crystal III-N material on a semiconductor substrate wherein the method includes providing a substrate including a first layer of one of crystalline silicon or germanium, an intermediate layer of single crystal rare earth oxide, and a second layer of one of crystalline silicon or germanium. A step of epitaxially growing a single crystal III-N material on the second layer using a process that elevates the temperature of the second layer and the intermediate layer into a range of approximately 750° C. to approximately 1250° C. in the presence of a III containing species, whereby a portion of the second layer and the intermediate layer is transformed to a rare earth silicide. It should be understood that a proportion of the second layer and the intermediate layer, generally in a range of 1% to 100%, can undergo transformation to a new alloy such as rare earth nitride or rare earth silicide.

The desired objects and aspects of the instant invention are further realized in accordance with a specific embodiment of a structure with a substrate including one of crystalline silicon or germanium, a layer of rare earth oxide epitaxially grown on the substrate, and a layer of single crystal III-N material epitaxially grown on the layer of rare earth oxide. The layer of rare earth oxide includes a portion of rare earth oxide adjacent the substrate and a portion of one of rare earth nitride and rare earth silicide adjacent the layer of single crystal III-N material.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 1B is a chart illustrating the crystal lattice mismatches of FIG. 1A;

FIG. 2 is a simplified layer diagram of an intermediate step in an example of a process in accordance with the present invention;

FIGS. 3-5 illustrate graphically X-ray data obtained from 3 different process runs in accordance with the present invention;

FIG. 6 is a simplified layer diagram of a III-N material epitaxially grown on a semiconductor substrate in accordance with the present invention;

DETAILED DESCRIPTION OF THE DRAWINGS

Figure 1A:
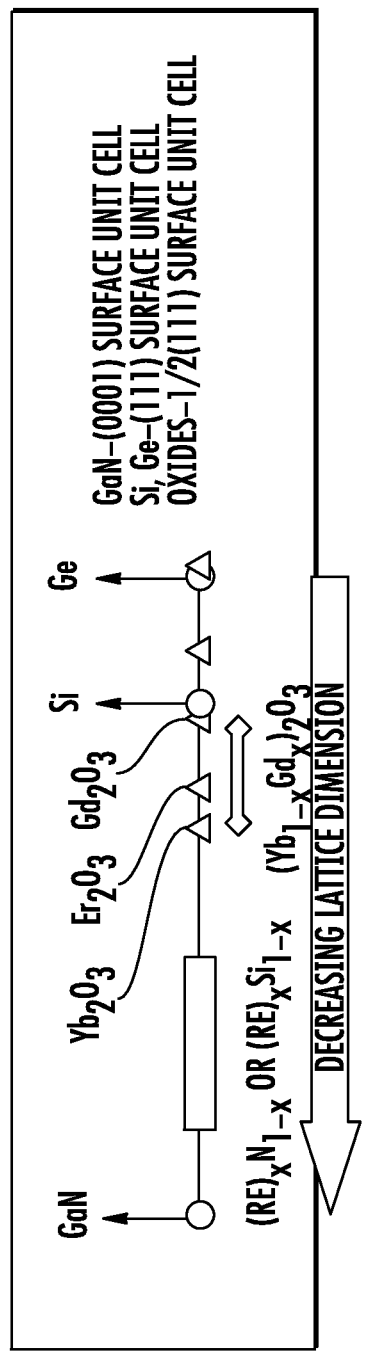
FIG. 1A is a schematic diagram illustrating the relative lattice mismatch between exemplary rare earth oxides and III-N material grown on a Si or Ge structure in accordance with the present invention.

Referring to the figures, a schematic diagram designated FIG. 1A, illustrates the crystal lattice mismatch between various rare earth oxides and a III-N material, in this example GaN, and a Si or Ge substrate. It is known that growing GaN, on a silicon substrate is difficult due in large part to the large crystal lattice mismatch (−16.9%) between silicon and GaN. Some efforts have been made to intersperse layers of rare earth oxides between the substrate and the III-N layer as depicted by $Gd_2O_3$, $Er_2O_3$, and $Yb_2O_3$. However, while all of the oxides substantially match with silicon ($Gd_2O_3$ being the closest) the smallest rare earth oxide, which is Lu2O3, still has a 13.2% mismatch with GaN. Thus, a better solution is to add some additional material between the REO and the GaN to further reduce the lattice gap. In this example the suggested additional material includes a rare earth nitride, $(RE)_x N_{1-x}$ or a rare earth silicide, $(RE)_x Si_{1-x}$. For example, an additional material such as ErN would reduce the mismatch with GaN to only 6.9%. A chart illustrating the mismatches detailed above is illustrated in FIG. 1B.

Turning to FIG. 2, a simplified layer diagram or schematic illustrates an intermediate step in a process in accordance with the present invention. In this process a layer 12 of rare earth oxide is epitaxially deposited on a semiconductor substrate 10. Throughout this disclosure whenever rare earth materials are mentioned it will be understood that "rare earth" materials are generally defined as any of the lanthanides as well as scandium and yttrium. Substrate 10 is preferably single crystal silicon but could include any of the other well known material such as germanium, or alloys including silicon or germanium, all of which are referred to herein as "semiconductor materials" or "semiconductor substrate".

A layer 14 of III-N material is epitaxially grown on layer 12 of rare earth oxide. Whenever III-N materials are mentioned it will be understood that "III-N" materials are generally defined as nitrides of any of the III materials from the periodic table of elements. Layer 14 is grown as a post-oxide process, i.e. it is grown subsequent to the growth layer 12 of rare earth oxide. In the specific process illustrated schematically in FIG. 2, the III-N material is grown using a high temperature process, such as MOCVD. In this process the temperature of the rare earth oxide is elevated to within a range of approximately 750° C. to approximately 1250° C. At the elevated temperature and in the presence of N containing species (for example $NH_3$) portions of the rare earth oxide undergo transformation to new alloys, such as rare earth nitrides or rare earth silicides.

Referring additionally to FIGS. 3-5, results from 3 different MOCVD process runs are illustrated for the growth of GaN on different rare earth oxides. In each of the results a new rare earth alloy can be seen, as indicated by the arrows. X-ray peaks were measured at 32.083 degrees, 31.097 degrees, and 31.097 degrees for erbium oxide, gadolinium oxide, and ytterbium oxide, respectively. Using an X-ray wavelength $\lambda=2d\sin(2\theta)$, where $2\theta$ is the peak values quoted above, the lattice parameters of the three compounds were calculated as:

a(ErN)=4.8303 Å
a(GdN)=4.977 Å
a(YbN)=4.770 Å

The literature values for these are:

a(ErN)=4.839 Å
a(GdN)=4.999 Å
a(YbN)=4.786 Å

The maximum difference between the measured values in the present process and the literature value is less than 0.5%. The literature values were taken from W. Klem & G. Winkelmann, Nitrides of the Rare-Earth Metals, *Z Anorg. Allgem. Chem.*, Vol. 288, p87 1956.

Turning now to FIG. 6 a simplified layer diagram is illustrated of a structure 20 including a III-N material epitaxially grown on a semiconductor substrate in accordance with the present invention. Structure 20 includes a semiconductor substrate 22 with a layer 24 of rare earth oxide epitaxially grown thereon. A layer 26 of III.N material is epitaxially grown on layer 24 by a process including a temperature that elevates the temperature of layer 24 into a range of approximately 750° C. to approximately 1250° C. Because the III-N material is a nitride, the epitaxial growth includes the presence of an N containing species. As explained above, the elevated temperature of the rare earth oxide in layer 24 in the presence of the N containing species causes portions of layer 24 to undergo transformation to a new alloy.

As depicted in FIG. 6, a portion, designated 24a, of layer 24 remains as a rare earth oxide to substantially crystal lattice match with semiconductor substrate 22. Another portion, designated 24b, is transformed into a rare earth nitride to form a substantial lattice match with layer 26 of the III-N material. Generally, the transformation will occur gradually so that no substantial lattice mismatch occurs between portion 24a and 24b.

Figures 7, 8:
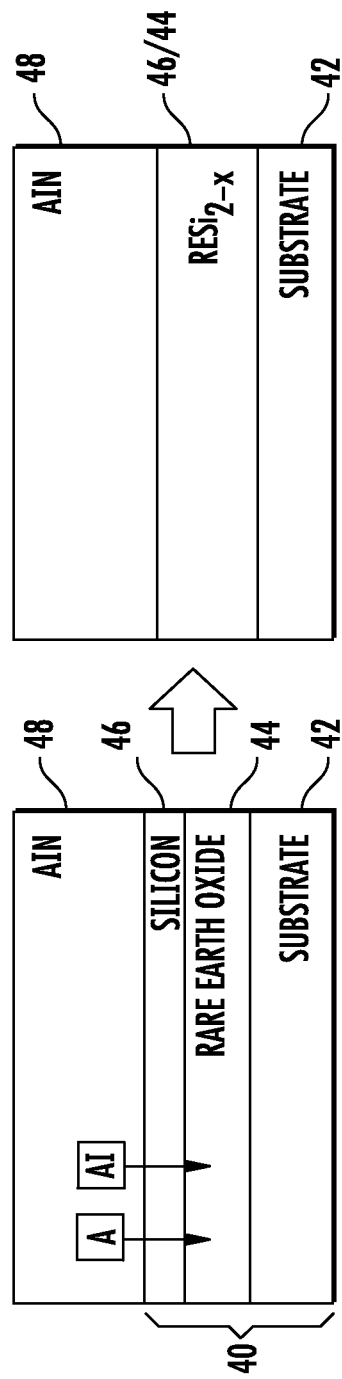
FIG. 7 is a simplified layer diagram of an intermediate step in an example of another process in accordance with the present invention.
FIG. 8 is a simplified layer diagram of AlN epitaxially grown on a semiconductor substrate in accordance with the present invention.

Turning now to FIG. 7, a simplified layer diagram or schematic illustrates an intermediate step in another process in accordance with the present invention. In this process a substrate 40 including a first or lower layer 42 of single crystal silicon, an intermediate layer 44 of a single crystal rare earth oxide, and a second or upper layer 46 of single crystal silicon is provided. Substrate 40 may be for example a silicon-on-insulator (SOI) substrate or may simply be a silicon substrate with a layer of REO epitaxially grown thereon and a thin layer (e.g. layer 46) of silicon epitaxially grown on the REO layer.

A layer 48 of AlN is epitaxially grown on layer 46 of single crystal silicon and subsequent to the growth of layer 46. In the specific process illustrated schematically in FIG. 7, the AlN is grown using a high temperature process, such as MBE. In this process the temperature of rare earth oxide layer 44 and silicon layer 48 is elevated to within a range of approximately 750° C. to approximately 1250° C. At the elevated temperature and in the presence of the Al containing species portions of the rare earth oxide and the silicon undergo transformation to new alloys, such as rare earth silicides ($RESi_{2-x}$).

Figure 9:
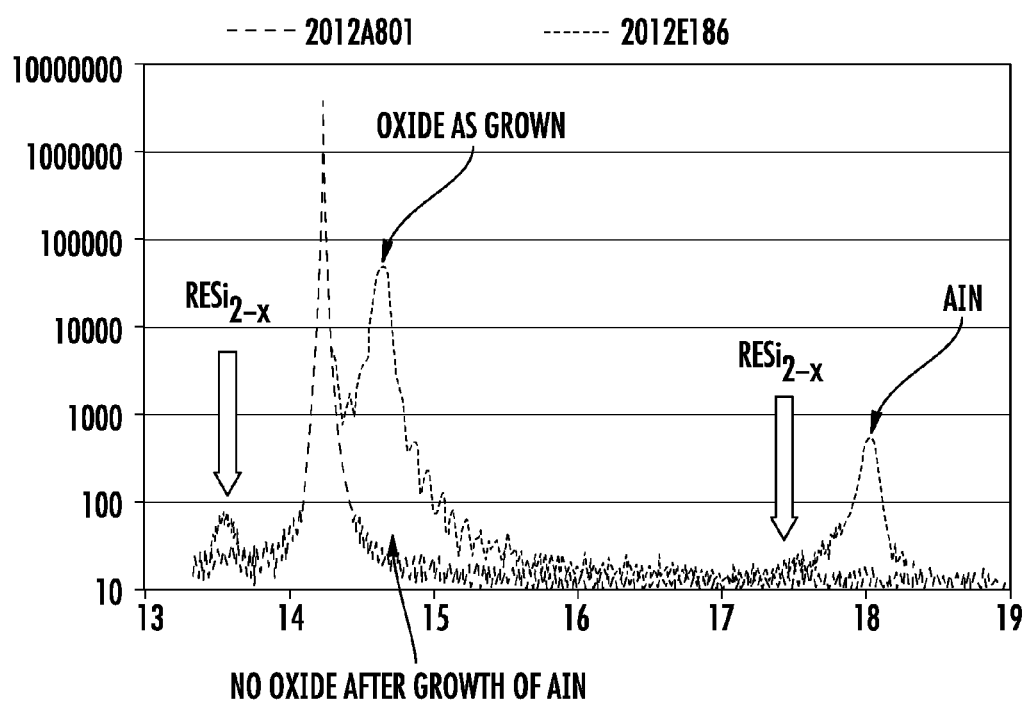
FIG. 9 illustrates graphically x-ray data from the starting substrate including oxide and data obtained from the growth of AlN on a Si/REO/Si substrate.

Referring additionally to FIG. 8, a simplified layer diagram is illustrated of AlN layer 48 epitaxially grown a layer 46/44 of rare earth silicides ($RESi_{2-x}$) in accordance with the present invention. Illustrated in FIG. 9 is a graphical representation of x-ray data obtained from the growth of AlN on a Si/REO/Si substrate shown in FIGS. 7 and 8. It should be understood that while all of the REO and the upper layer of silicon are shown transformed to a rare earth silicide some of the rare earth oxide may remain adjacent the lower silicon layer. That is a proportion of the REO, generally in a range of 1% to 100%, can undergo transformation to a new alloy such as rare earth nitride or rare earth silicide.

Thus, new and improved methods for the growth of single crystal III-N materials on a semiconductor substrate (an SOI or simply a silicon or germanium wafer or portion thereof) are disclosed. The new and improved methods more closely lattice match single crystal III-N materials to a semiconductor substrate. Also, new and improved substantially lattice matched single crystal III-N material epitaxially grown on a semiconductor substrate is disclosed. As understood from the above disclosure the growth methods are relatively easy and do not include any additional steps or complicated processes.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A method of growing single crystal III-N material on a semiconductor substrate comprising the steps of:
   providing a substrate including one or more layers of one of crystalline silicon or germanium and a layer of rare earth oxide; and
   epitaxially growing a single crystal III-N material on the substrate using a process that elevates the temperature of the layer of rare earth oxide into a range of approximately 750° C. to approximately 1250° C. in the presence of one of a nitrogen containing species or a III-material species, whereby a portion of the layer of rare earth oxide is transformed to a new alloy.

2. A method as claimed in claim 1 wherein the new alloy includes one of rare earth nitride and rare earth silicide.

3. A method as claimed in claim 1 wherein the substrate includes a first layer of single crystal silicon, an intermediate layer of single crystal rare earth oxide, and a second layer single crystal silicon.

4. A method as claimed in claim 3 wherein the III-material species includes AlN.

5. A method as claimed in claim 4 wherein the epitaxial process that elevates the temperature includes MBE.

6. A method of growing single crystal III-N material on a semiconductor substrate comprising the steps of:
   providing a substrate including one of crystalline silicon or germanium;
   epitaxially growing a layer of single crystal rare earth oxide on the substrate; and
   epitaxially growing a single crystal III-N material on the layer of rare earth oxide using a process that elevates the temperature of the layer of rare earth oxide into a range of approximately 750° C. to approximately 1250° C. in the presence of an N containing species, whereby a portion of the layer of rare earth oxide is transformed to a new alloy.

7. A method as claimed in claim 6 wherein the new alloy includes one of rare earth nitride and rare earth silicide.

8. A method as claimed in claim 6 wherein the step of providing a substrate includes providing a silicon substrate.

9. A method as claimed in claim 6 wherein the step of epitaxially growing a layer of rare earth oxide includes growing a layer including one of $Gd_2O_3$, $Er_2O_3$, $Lu_2O_3$ and $Yb_2O_3$.

10. A method as claimed in claim 6 wherein the step of epitaxially growing a single crystal III-N material includes epitaxially growing a layer of GaN.

11. A method as claimed in claim 6 wherein the step of using a process that elevates the temperature of the layer of rare earth oxide includes using an MOCVD process.

12. A method as claimed in claim 6 wherein the step of using a process that elevates the temperature of the layer of rare earth oxide in the presence of an N containing species includes using $NH_3$ as the N containing species.

13. A method of growing single crystal III-N material on a semiconductor substrate comprising the steps of:
   providing a substrate including a first layer of one of crystalline silicon or germanium, an intermediate layer of single crystal rare earth oxide, and a second layer of one of crystalline silicon or germanium; and
   epitaxially growing a single crystal III-N material on the second layer using a process that elevates the temperature of the second layer and the intermediate layer into a range of approximately 750° C. to approximately 1250° C. in the presence of a III containing species, whereby a portion of the second layer and the intermediate layer is transformed to a rare earth silicide.

14. A method as claimed in claim 13 wherein the III-N material includes AlN and the III material species is Al.

15. A method as claimed in claim 13 wherein the portion of the second layer and the intermediate layer transformed is in a range of 1% to 100%.

16. A method as claimed in claim 14 wherein the step of using a process that elevates the temperature of the layer of rare earth oxide includes using an MBE process.

17. A structure including single crystal III-N material on a semiconductor substrate comprising:
   a substrate including one of crystalline silicon or germanium;
   a layer of single crystal rare earth oxide epitaxially grown on the substrate;
   a layer of single crystal III-N material epitaxially grown on the layer of rare earth oxide; and
   the layer of rare earth oxide including a portion of rare earth oxide adjacent the substrate and a portion of one of rare earth nitride and rare earth silicide adjacent the layer of single crystal III-N material.

18. A structure as claimed in claim 17 wherein the substrate includes a silicon substrate.

19. A structure as claimed in claim 17 wherein the layer of rare earth oxide includes one of $Gd_2O_3$, $Er_2O_3$, $Lu_2O_3$ and $Yb_2O_3$.

20. A structure as claimed in claim 17 wherein the single crystal III-N material includes a layer of GaN.

\* \* \* \* \*